(12) United States Patent
Shimizu et al.

(10) Patent No.: US 7,536,780 B2
(45) Date of Patent: May 26, 2009

(54) METHOD OF MANUFACTURING WIRING SUBSTRATE TO WHICH SEMICONDUCTOR CHIP IS MOUNTED

(75) Inventors: Noriyoshi Shimizu, Nagano (JP); Tomoo Yamasaki, Nagano (JP); Kiyoshi Oi, Nagano (JP); Akio Rokugawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 361 days.

(21) Appl. No.: 11/311,568

(22) Filed: Dec. 19, 2005

(65) Prior Publication Data

US 2006/0131069 A1    Jun. 22, 2006

(30) Foreign Application Priority Data

Dec. 20, 2004    (JP) .............................. 2004-367945

(51) Int. Cl.
*H05K 3/36* (2006.01)
(52) U.S. Cl. .............................. 29/830; 29/846; 29/852; 438/105; 438/406
(58) Field of Classification Search ......... 438/105–107, 438/406–408, 445; 361/717; 29/25.35–25.42, 29/830, 846, 852; 174/250–255, 262–264
See application file for complete search history.

(56) References Cited

U.S. PATENT DOCUMENTS

| 6,121,112 | A  | * | 9/2000 | Sakaguchi et al. | .......... 438/406 |
| 6,459,046 | B1 | * | 10/2002 | Ochi et al. | .................. 174/256 |
| 6,871,396 | B2 | * | 3/2005 | Sugaya et al. | ................ 29/860 |
| 6,936,774 | B2 | * | 8/2005 | Sugaya et al. | ............... 174/255 |
| 7,138,294 | B2 | * | 11/2006 | Nishitani et al. | ............ 438/107 |
| 7,276,429 | B2 | * | 10/2007 | Yamanaka | ................... 438/455 |
| 7,297,562 | B1 | * | 11/2007 | Huemoeller et al. | .......... 438/15 |
| 2001/0023779 | A1 | * | 9/2001 | Sugaya et al. | ............... 174/255 |

FOREIGN PATENT DOCUMENTS

| JP | 2003264253 | 9/2003 |
| JP | 200414573 | 1/2004 |
| JP | 2004152883 | 5/2004 |
| JP | 2004281830 | 10/2004 |

\* cited by examiner

*Primary Examiner*—Minh Trinh
(74) *Attorney, Agent, or Firm*—Ladas & Parry LLP

(57) ABSTRACT

The present invention discloses a method of manufacturing a wiring substrate to which a semiconductor chip mounted. The method includes the steps of forming a base, forming a peeling layer on the base, forming a capacitor having a plurality of layers on the peeling layer, and forming a wiring part in the capacitor for connecting the capacitor to the semiconductor chip.

8 Claims, 8 Drawing Sheets

METHOD OF MANUFACTURING WIRING SUBSTRATE TO WHICH SEMICONDUCTOR CHIP IS MOUNTED

BACKGROUND OF THE INVENTION

1. Field of the Invention

The present invention generally relates to a method of manufacturing a wiring substrate, having a semiconductor chip decoupling capacitor, to which a semiconductor chip is mounted.

2. Description of the Related Art

In recent years and continuing, there is a trend for forming smaller and thinner semiconductor devices (e.g. semiconductor chips). Along with this trend, there is a growing demand for forming smaller and thinner decoupling capacitors (also referred to as "decoupling condenser" and "bypass condenser") used for stabilizing operations by controlling changes of electric voltage of a semiconductor chip, for example.

Furthermore, since the operating frequency of semiconductor chips is expected to be increased for improving the operating speed of semiconductor chips, the decoupling capacitor is preferred to be set (positioned) as near as possible to the semiconductor chip so as to reduce the inductance of the connection of the decoupling capacitor.

Accordingly, various decoupling capacitors and methods for setting decoupling capacitors are proposed.

For example, in a related art case of mounting a semiconductor chip to a wiring substrate, there is a method of mounting a decoupling capacitor on the rear side of the wiring substrate (i.e. opposite from the side on which the semiconductor chip is mounted). As for other related art cases, there are methods of employing various configurations or shapes having a decoupling capacitor buried in the wiring substrate.

However, in the related cases of mounting the decoupling capacitor to the wiring substrate, there is a limit to manufacturing a thinner decoupling capacitor and a limit to manufacturing a thinner/smaller wiring substrate for such decoupling capacitor.

SUMMARY OF THE INVENTION

It is a general object of the present invention to provide a method for manufacturing a wiring substrate that substantially obviates one or more of the problems caused by the limitations and disadvantages of the related art.

Features and advantages of the present invention are set forth in the description which follows, and in part will become apparent from the description and the accompanying drawings, or may be learned by practice of the invention according to the teachings provided in the description. Objects as well as other features and advantages of the present invention will be realized and attained by manufacturing a wiring substrate particularly pointed out in the specification in such full, clear, concise, and exact terms as to enable a person having ordinary skill in the art to practice the invention.

To achieve these and other advantages and in accordance with the purpose of the invention, as embodied and broadly described herein, the present invention provides a method of manufacturing a wiring substrate to which a semiconductor chip is mounted, the method including the steps of forming a base, forming a peeling layer on the base, forming a capacitor having a plurality of layers on the peeling layer, and forming a wiring part in the capacitor for connecting the capacitor to a semiconductor chip.

In the method of manufacturing a wiring substrate according to an embodiment of the present invention, the plural layers of the capacitors may be formed by performing the steps of: forming a first electrode layer on the peeling layer; forming a dielectric layer on the first electrode layer; and forming a second electrode layer on the dielectric layer.

In the method of manufacturing a wiring substrate according to an embodiment of the present invention, at least one of the first electrode layer and the second electrode layer may include Cu.

In the method of manufacturing a wiring substrate according to an embodiment of the present invention, the peeling layer may include at least one of Mo, Ta, and Pt.

The method of manufacturing a wiring substrate according to an embodiment of the present invention further includes a step of: forming via holes in the first and second electrode layers, wherein the wiring parts include via wirings that are mounted in the via holes of the first and second electrode layers.

In the method of manufacturing a wiring substrate according to an embodiment of the present invention, the step of forming via holes in the first and second electrode layers may include the steps of: forming first via holes in the second electrode layer; forming an insulation layer on the second electrode layer after the step of forming the first via holes; and peeling the base from the first electrode layer and forming second via holes in correspondence with the first via holes after the step of forming the insulation layer.

In the method of manufacturing a wiring substrate according to an embodiment of the present invention, the method may further include the steps of: forming via wirings that penetrate the via holes after the step of forming the via holes; and forming a multilayer wiring including the via wirings that electrically connect a first side of the wiring substrate to an oppositely situated second side of the wiring substrate.

In the method of manufacturing a wiring substrate according to an embodiment of the present invention, the dielectric layer may include at least one of $Ta_2O_5$, STO, BST, PZT, and BTO.

Other objects and further features of the present invention will be apparent from the following detailed description when read in conjunction with the accompanying drawings.

DESCRIPTION OF THE PREFERRED EMBODIMENTS

In the following, embodiments of the present invention are described with reference to the accompanying drawings.

A method of forming a capacitor 100 according to an embodiment of the present invention is described with reference to FIGS. 1A-1F.

Figure 1A:
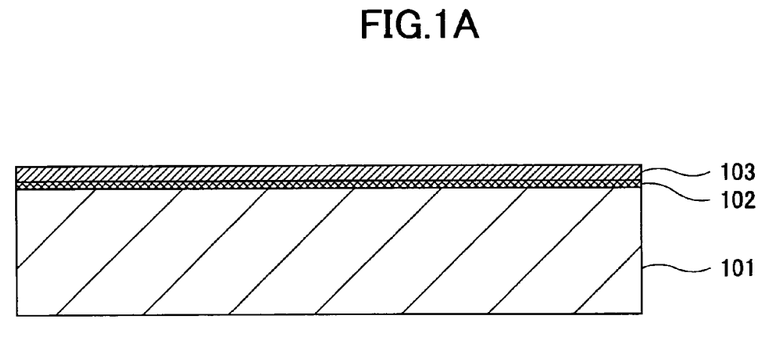
FIG. 1A is a schematic diagram (Part 1) for describing a method for forming a capacitor according to an embodiment of the present invention.

In FIG. 1A, a base 101 includes a peeling layer 102 formed thereon. The base 101 includes, for example, at least one of Si, glass (silica glass, borosilicate glass) and metal material. In this example, the base 101 has a thickness of approximately 500 μm to 1000 μm. In this example, the peeling layer 102 has a thickness of approximately 500 nm to 1000 nm.

The capacitor 100 (See FIG. 1F) according to an embodiment of the present invention includes plural layers which are to be formed on the peeling layer 102 in a subsequent step (described below). Furthermore, the base 101 is peeled apart from the plural layers of the capacitor 100 in another subsequent step so as to reduce the thickness of the capacitor 100. The peeling layer 102 enables the base 101 to be easily peeled apart from the plural layers of the capacitor 100.

Next, a first electrode layer 103 is formed on the peeling layer 102. The first electrode layer 103 includes, for example, a conductive layer such as a copper (Cu) plating layer. In this case, the adhesion between the first electrode layer 103 and the peeling layer 102 is preferred to be less than the adhesion among the layers included in the plural layers of the capacitor 100. For example, the adhesion between the first electrode layer 103 and the peeling layer 102 is preferred to be less than the adhesion between the first electrode layer 103 and another layer included in the capacitor 100.

For example, in a case where the first electrode layer 103 is formed with a Cu plating material, the peeling layer 102 is preferred to be formed with a material exhibiting a relatively low adhesive property with respect to the Cu plating layer, such as a Mo (molybdenum) material. By employing such material as the peeling layer 102, the base 101 can be easily peeled apart from the plural layers of the capacitor 100. For example, the peeling layer 102 made of Mo material may be formed by a sputtering method.

One cause for the relatively low adhesive relationship between the Cu plating layer (first electrode layer 103) and the Mo layer (peeling layer 102) may be that the stress of Cu itself or the stress of Mo itself weakens the adhesion therebetween.

The material used for the peeling layer 102 is not limited to Mo material. Other alternative materials that exhibit a relatively low adhesive property with respect to the first electrode layer 103 may be employed as the material of the peeling layer 102 (e.g. metal materials such as Ta, Pt). The method for forming the peeling layer 102 is not limited to the sputtering method. Other methods such as a vacuum evaporation method may also be employed.

Figure 1B:
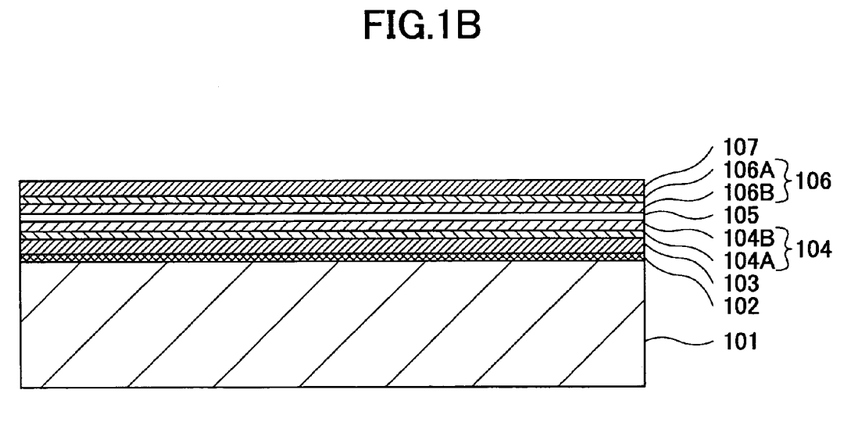
FIG. 1B is a schematic diagram (Part 2) for describing a method for forming a capacitor according to an embodiment of the present invention.

Next, in the step shown in FIG. 1B (step for forming the plural layers of the capacitor 100), a dielectric layer 105 is formed on the first electrode layer 103, and a second electrode layer 107 is formed on the dielectric layer 105. The dielectric layer 105 may be formed on the first electrode layer 103 via a barrier layer 104, and/or the second electrode layer 107 may be formed on the dielectric layer 105 via another barrier layer 106. The barrier layers 104 and/or 106 provided between the dielectric layer 105 and the first electrode layer 103 and/or between the dielectric layer 105 and the second electrode layer 107 serve to prevent metal materials from diffusing therebetween. One example of such configuration is described more specifically below.

In FIG. 1B, the barrier layer 104 including a metal layer 104A and another metal layer 104B, for example, is formed on the first electrode layer 103. In this example, the metal layer 104A is formed of Ti, and the other metal layer 104B is formed of Pt.

Then, the dielectric layer 105 is formed on the barrier layer 104. In this example, the dielectric layer 105 includes an anodic oxide coating of Ta ($Ta_2O_5$) that has a thickness of 300 nm. As for the conditions for the anodic oxidation of the anodic oxide coating, the voltage for the oxidation is 200 V, and the solution used for the oxidation is a citric acid solution. The dielectric layer 105 is not limited to the $Ta_2O_5$ coating. For example, by alternatively employing a ferroelectric coating having a high dielectric constant, the capacitance of the capacitor 100 can be increased. Examples of such coating include, a coating formed of at least one of STO ($SrTiO_3$: strontium titanate) BST ($(Ba, Sr) TiO_3$: strontium barium titanate), PZT ($Pb (Zr, Ti) O_3$: lead zirconate titanate) and BTO ($BaTiO_3$: barium titanate). Various methods may be used for forming the coating (e.g. CVD method).

Then, the barrier layer 106 including a metal layer 106B and another metal layer 106A, for example, is formed on the dielectric layer 105. In this example, the metal layer 106A is formed of Ti, and the other metal layer 106B is formed of Pt.

Then, the second electrode layer 107 including a Cu plating layer, for example, is formed on the barrier layer 106. Thereby, the plural layers of the capacitor 100 are formed.

The capacitor 100 having the plural layers (including the first electrode layer 103, the barrier layer 104, the dielectric layer 105, the barrier layer 106, and the second electrode layer 107) is subjected to a step of forming via wiring that penetrate the capacitor 100 (described below with reference to FIGS. 2A-2F). In the next step shown in FIG. 1C, via holes BH1, which allow the via wirings to be provided therethrough, are formed.

Figure 1C:
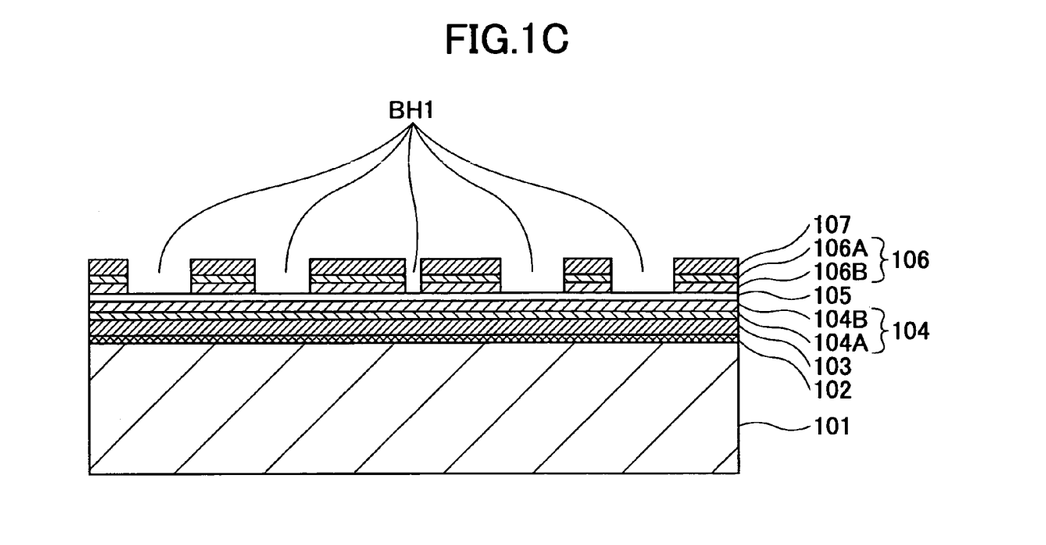
FIG. 1C is a schematic diagram (Part 3) for describing a method for forming a capacitor according to an embodiment of the present invention.

In FIG. 1C, a resist pattern is formed on the second electrode layer 107 by employing a photolithography method, and the second electrode layer 107 and the barrier layer 106 are etched by using the resist pattern formed on the second electrode layer 107 as a mask. Thereby, the via holes BH1 are formed.

Figure 1D:
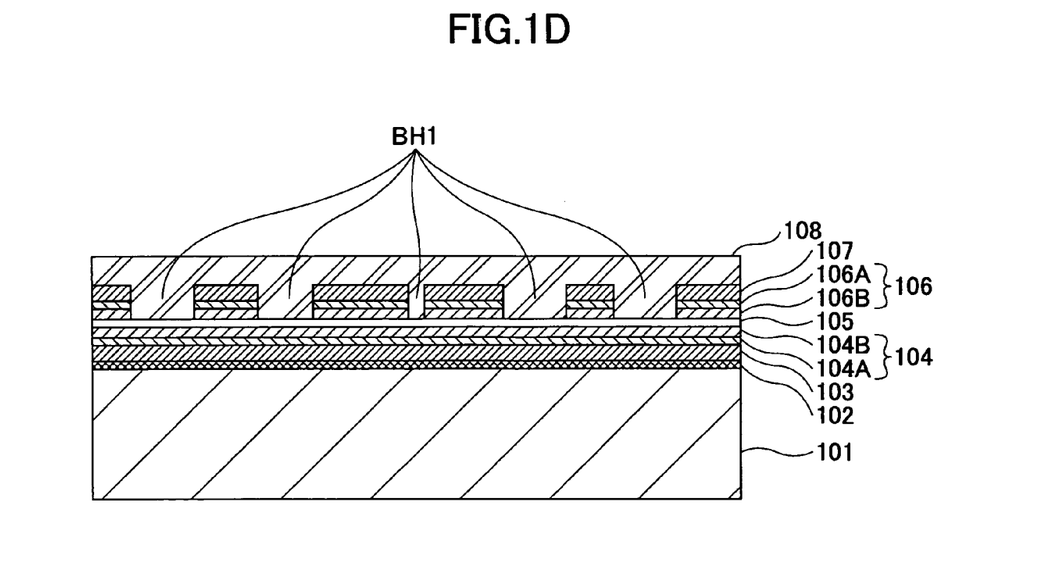
FIG. 1D is a schematic diagram (Part 4) for describing a method for forming a capacitor according to an embodiment of the present invention.

Then, in the step shown in FIG. 1D, an insulation layer 108 is formed in a manner such that the via holes BH1 are filled and the second electrode layer 107 is covered. The insulation layer 108 may be formed of, for example, a resin material (e.g. epoxy resin). The insulation layer 108 may be formed by employing, for example, a lamination method, or various coating methods.

Figure 1E:
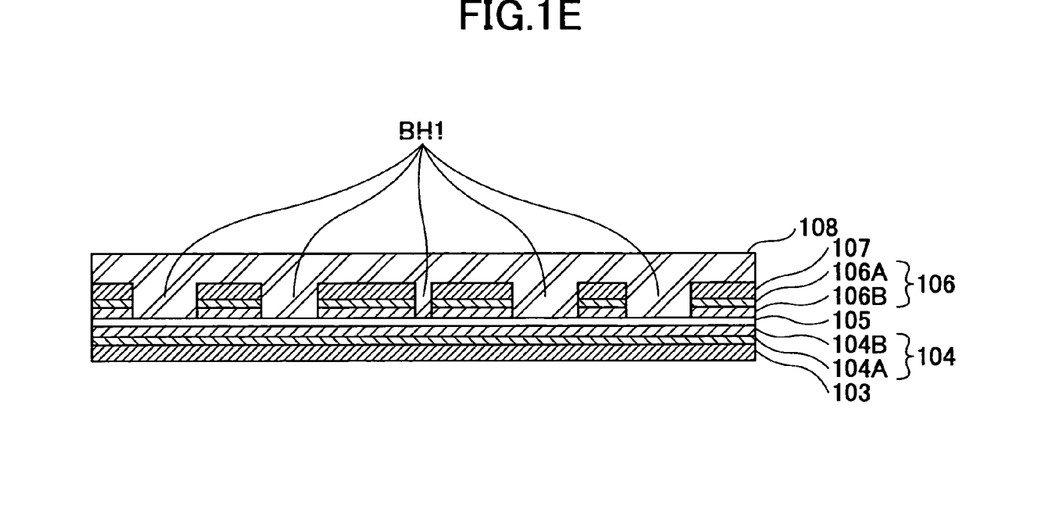
FIG. 1E is a schematic diagram (Part 5) for describing a method for forming a capacitor according to an embodiment of the present invention.

Then, in the step shown in FIG. 1E, the base 101, which includes the peeling layer 102 formed thereon, is peeled apart from the plural layers of the capacitor 100. For example, the peeling procedure may be performed by slightly applying a mechanical force at a predetermined portion between the base 101 and the plural layers with use of, for example, a cutter or a laser, and then peeling the base 101 including the peeling layer 102 apart from the plural layers of the capacitor 100. In this example, the plural layers of the capacitor 100 (including the first electrode layer 103, the barrier layer 104, the dielectric layer 105, the barrier layer 106, the second electrode layer 107, and the insulating layer 108) are peeled apart from the base 101 including the peeling layer 102 at the interface between the first electrode layer 103 and the peeling layer 102. Accordingly, the capacitor 100 according to an embodiment of the present invention can be formed having small thickness. Furthermore, the plural layers of the capacitor 100 and the base 101 can be easily separated since their adhesions with the peeling layer 102 (including Mo, for example) are less than the adhesion between the first electrode layer 103 and the barrier layer 104, the adhesion between the barrier layer 104 and the dielectric layer 105, the adhesion between the dielectric layer 105 and the barrier layer 106, and the adhesion between the barrier layer 106 and the second electrode layer 107.

Furthermore, the plural layers of the capacitor 100 can maintain a stable structure since the insulation layer 108 serves to support the plural layers of the capacitor 100. Accordingly, it is preferable to separate the base 101 after the insulation layer 108 is formed. The forming of the insulating layer 108 neither affects the thickness of the capacitor 100 nor the thickness of the wiring substrate including the capacitor 100 since the insulating layer 108 also serves as an interlayer insulation layer disposed between the capacitor 100 and a multilayer wiring structure (formed in a subsequent step described below).

That is, according to one embodiment of the present invention, a component affecting the thickness of the capacitor 100 (e.g. base) can be omitted while still being able maintain a sufficiently stable structure for the capacitor 100.

Then, in the step shown in FIG. 1F, the capacitor 100 may be reversed (turned over) according to necessity, so that via holes BH2 can be formed for allowing via wirings (formed in a subsequent step described below) to be provided therethrough.

In this example, a resist pattern is formed on the first electrode layer 103 by employing a photolithography method, and the first electrode layer 103 and the barrier layer 104 are etched by using the resist pattern formed on the first electrode layer 103 as a mask. Thereby, the via holes BH2 are formed.

Figure 1F:
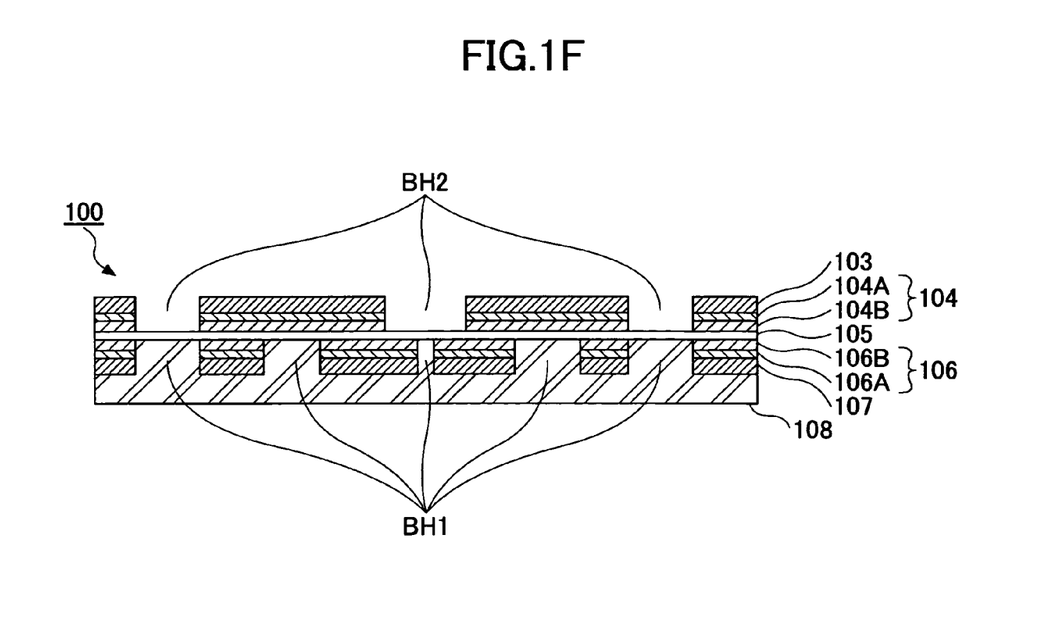
FIG. 1F is a schematic diagram (Part 6) for describing a method for forming a capacitor according to an embodiment of the present invention.

Furthermore, the dielectric layer 105 may also be subjected to the etching as shown in FIG. 1F. Alternatively, the dielectric layer 105 may be etched in the step shown in FIG. 1C.

In a case of forming the via wirings penetrating the via holes BH1 and BH2 in a subsequent step, some of the via wirings, which are to be used as electric power lines or ground lines, are formed so that they contact either the first electrode layer 103 or the second electrode layer 107. Accordingly, in the via holes BH1 and BH2 which are disposed on opposite sides, either the via holes BH1 or the via holes BH2 are formed with small diameters for contacting the via wirings and the other of the via holes BH1 or the via holes BH2 are formed with large diameters for avoiding contact with the via wirings.

Furthermore, other via wirings, which are to be used as signal lines, are formed so that they do not contact the first electrode layer 103 or the second electrode layer 107. The via holes BH1, BH2 corresponding to these other via wirings are formed with large diameters.

Next, a method of manufacturing a wiring substrate 300 having a multilayer wiring structure according to an embodiment of the present invention is described with reference to FIGS. 2A-2F. In FIGS. 2A-2F, like components are denoted with the same numerals as in FIGS. 1A-1F and are not further explained.

Figure 2A:
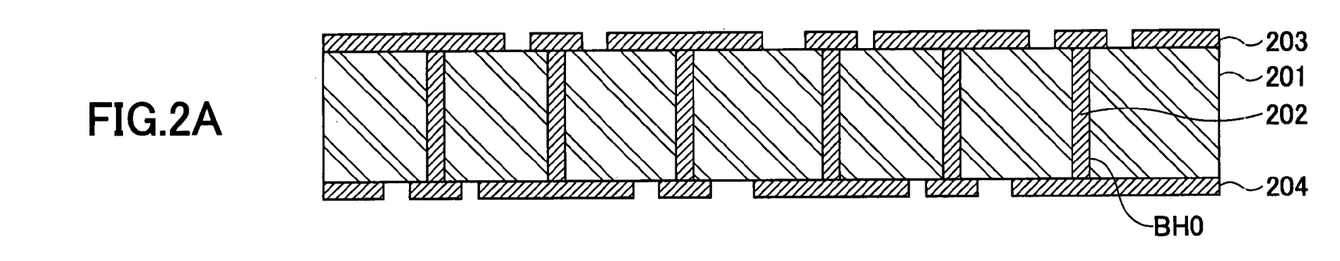
FIG. 2A is a schematic diagram (Part 1) for describing a method for manufacturing a wiring substrate according to an embodiment of the present invention.

First, in the step shown in FIG. 2A, via holes BH0 are formed in a core substrate 201, and via wirings 202 are formed in the via holes BH0. The core substrate 201 is formed of, for example, a resin material. The via wirings 202 are formed of, for example, Cu material. Then, pattern wirings 203, which are to be in contact with the via wirings 202 on a first side of the core substrate 201, are formed by a pattern plating method (e.g. semi-additive method) of Cu. Furthermore, pattern wirings 204, which are to be contact with the via wirings 202 on a second side of the core substrate 201 (i.e. the side opposite of the first side of the core substrate 201), are also formed by a pattern plating method (e.g. semi-additive method) of Cu. Alternatively, the pattern wirings 203, 204 may be formed by employing a pattern etching method which is performed by forming a Cu film and then etching a prescribed pattern on the Cu film.

Figure 2B:
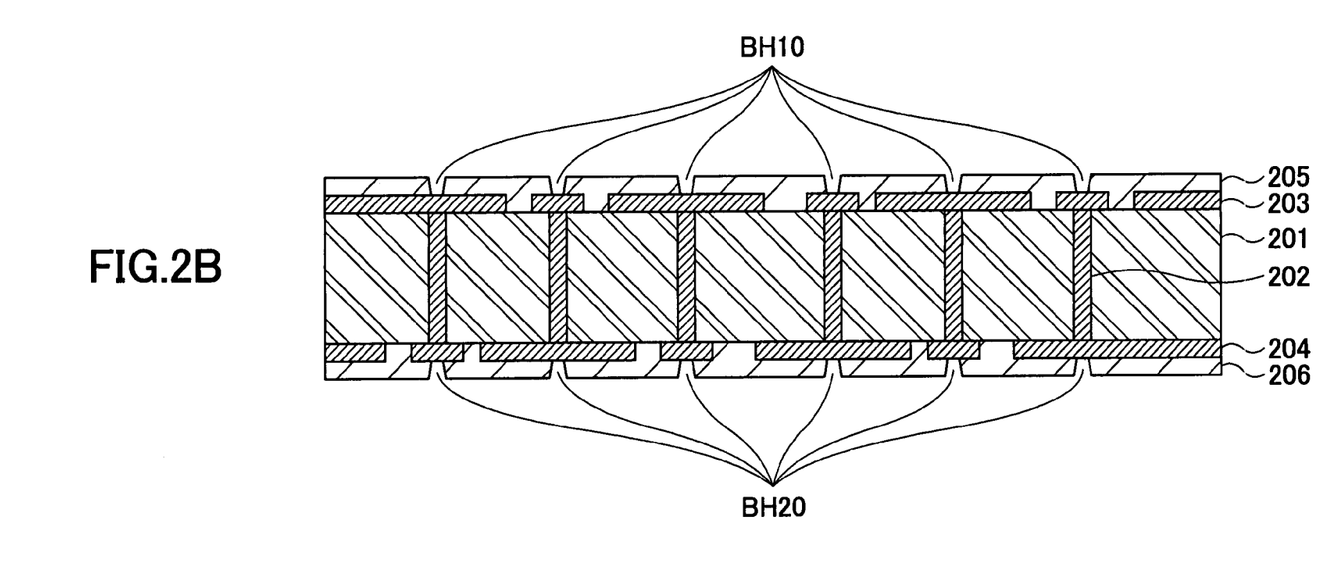
FIG. 2B is a schematic diagram (Part 2) for describing a method for manufacturing a wiring substrate according to an embodiment of the present invention.

Then, in the step shown in FIG. 2B, an insulation layer 205 is formed in a manner covering the pattern wirings 203. The insulation layer 205 may be formed of, for example, an epoxy resin. The insulation layer 205 may be formed by employing, for example, a lamination method or various coating methods. Then, via holes BH10 are formed in the insulation layer 205 by using a YAG laser, for example, such that a portion of the pattern wirings 203 are exposed. Likewise, another insulation layer 206 is formed in a manner covering the pattern wirings 204. The insulation layer 206 may be formed of, for example, an epoxy resin. The insulation layer 206 may be formed by employing, for example, a lamination method or various coating methods. Then, via holes BH20 are formed in the insulation layer 206 by using a YAG laser, for example, such that a portion of the pattern wirings 204 are exposed.

Figure 2C:
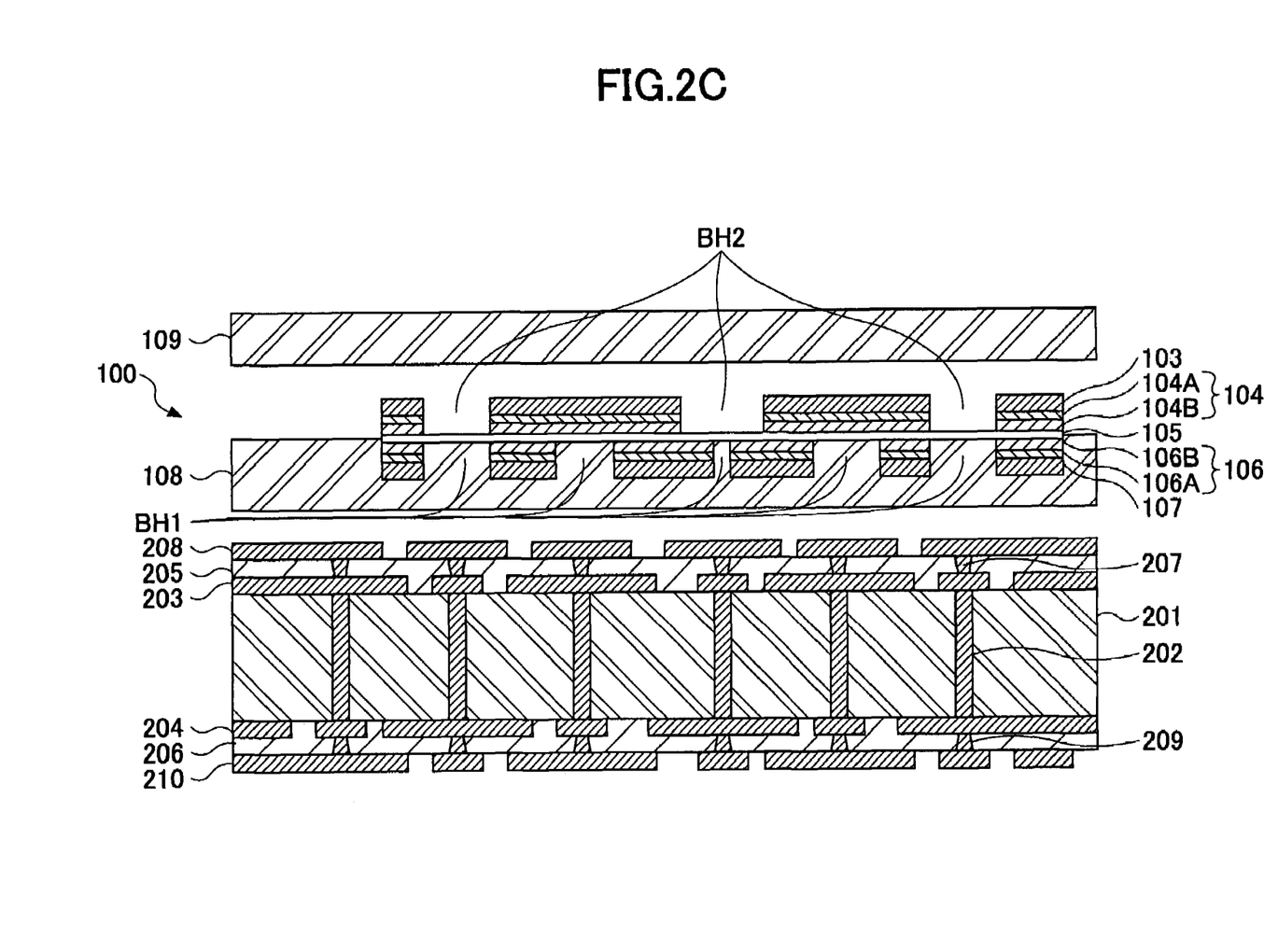
FIG. 2C is a schematic diagram (Part 3) for describing a method for manufacturing a wiring substrate according to an embodiment of the present invention.

Then, in the step shown in FIG. 2C, via wirings 207 are formed by, for example, Cu plating in a manner filling the via holes BH10 formed in the insulation layer 205. Furthermore, pattern wirings 208, which are to be connected to the via wirings 207, are formed by, for example, Cu plating on the insulation layer 205. Likewise, via wirings 209 are formed by, for example, Cu plating in a manner filling the via holes BH20. Furthermore, pattern wirings 210, which are to be connected to the via wirings 209, are formed by, for example, Cu plating on the insulation layer 206.

Then, the capacitor 100 shown in FIG. 1F is mounted on the pattern wirings 208. Furthermore, an insulation layer 109 is formed on the capacitor 100 in a manner covering the first electrode layer 103. The insulation layer 109 may be formed of, for example, an epoxy resin. The insulation layer 109 may be formed by employing, for example, a lamination method or various coating methods.

In this example, the insulation layer 108 and the insulation layer 109 form a united body (integral body) which serves as an interlayer insulation layer surrounding the capacitor 100. The interlayer insulation layer is referred to as insulation layer 110 as shown in FIG. 2D.

Figure 2D:
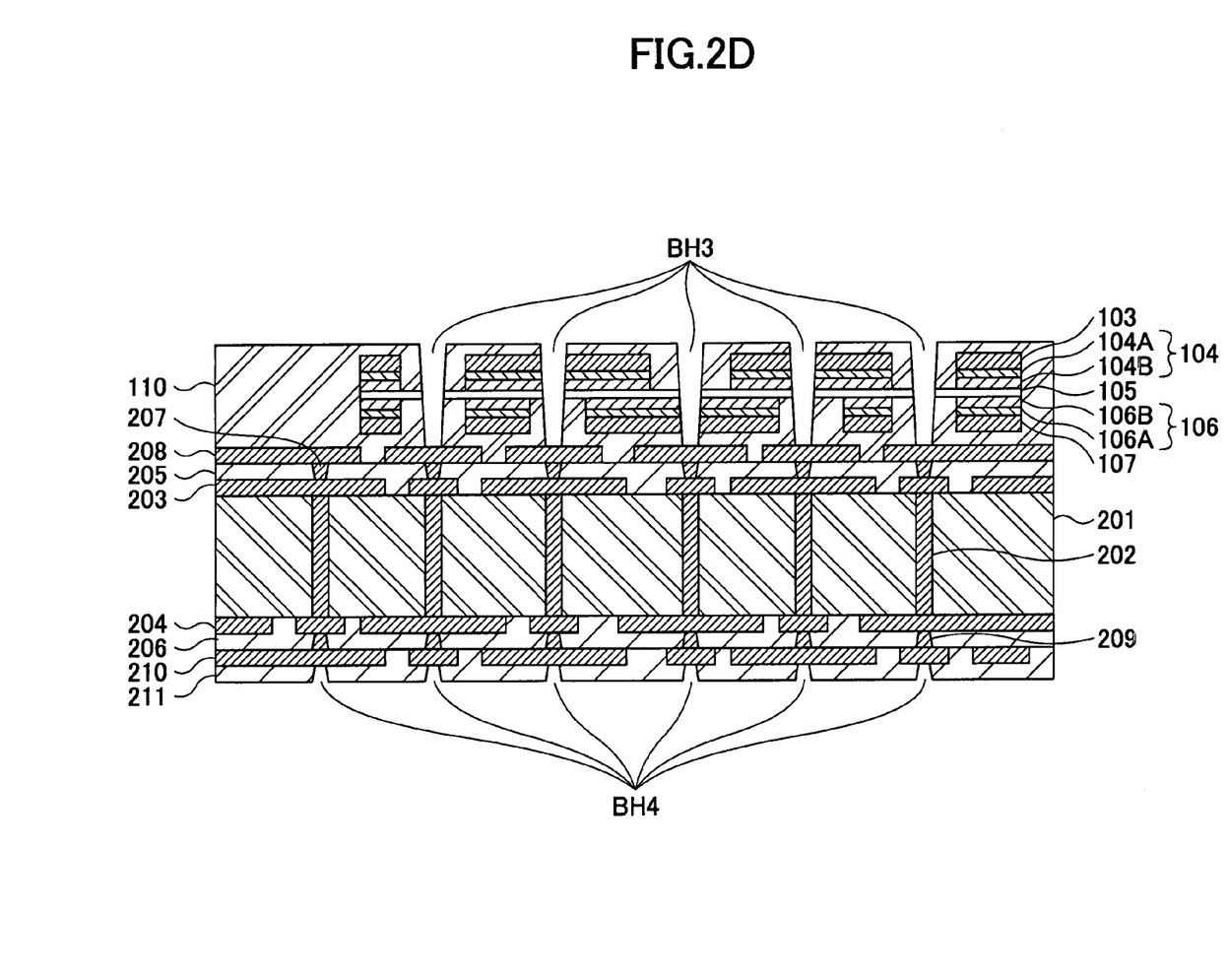
FIG. 2D is a schematic diagram (Part 4) for describing a method for manufacturing a wiring substrate according to an embodiment of the present invention.

Then, in the step shown in FIG. 2D, via holes BH3 are formed in a manner penetrating the insulation layer 110 (the portions of the insulation layer 110 which fill the via holes BH1, BH2) and the dielectric layer 105.

For example, the via holes BH3 may be formed by using a YAG laser with respect to the insulation layer 110 and employing a dry-etching method using a prescribed resist pattern as a mask with respect to the dielectric layer 105.

Alternatively, the via holes of the dielectric layer 105 may be formed in the step shown in FIG. 1C or FIG. 1F.

Furthermore, an insulation layer 211 is formed in a manner covering the pattern wirings 210. The insulation layer 211 may be formed of, for example, an epoxy resin. Furthermore, via holes BH4, which reach the pattern wirings 210, are formed in the insulation layer 211 by using a YAG laser, for example.

Figure 2E:
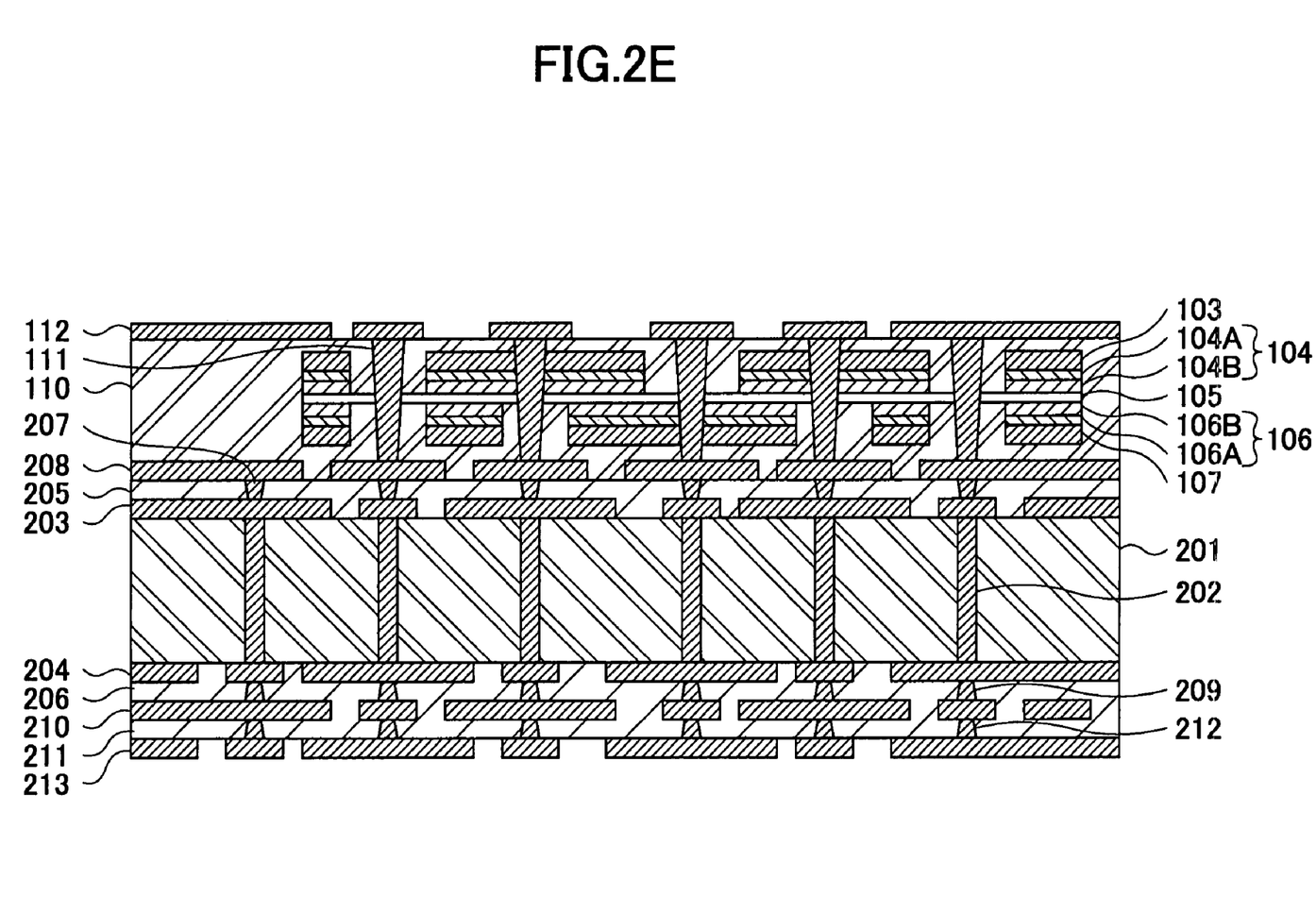
FIG. 2E is a schematic diagram (Part 5) for describing a method for manufacturing a wiring substrate according to an embodiment of the present invention.

Then, in the step shown in FIG. 2E, via wirings 111 are formed by, for example, Cu plating in a manner filling the via holes BH3 formed in the insulation layer 110. Furthermore, pattern wirings 112, which are to be connected to the via wirings 111, are formed by, for example, Cu plating on the insulation layer 110. Likewise, via wirings 212 are formed by, for example, Cu plating in a manner filling the via holes BH4. Furthermore, pattern wirings 213, which are to be connected to the via wirings 212, are formed by, for example, Cu plating on the insulation layer 211.

Among the above-described via wirings 111, 202, 207, 209, and 212, the via wirings that are to be used as power lines or ground lines are formed such that they electrically connect with the first electrode layer 103 or the second electrode layer 107. That is, such via wirings are provided so that the capacitor 100 can be disposed between the power lines and the ground lines. Meanwhile, among the via wirings 111, 202, 207, 209, and 212, the via wirings that are to be used as signal lines are formed such that they do not electrically connect with the first electrode layer 103 or the second electrode layer 107.

Figure 2F:
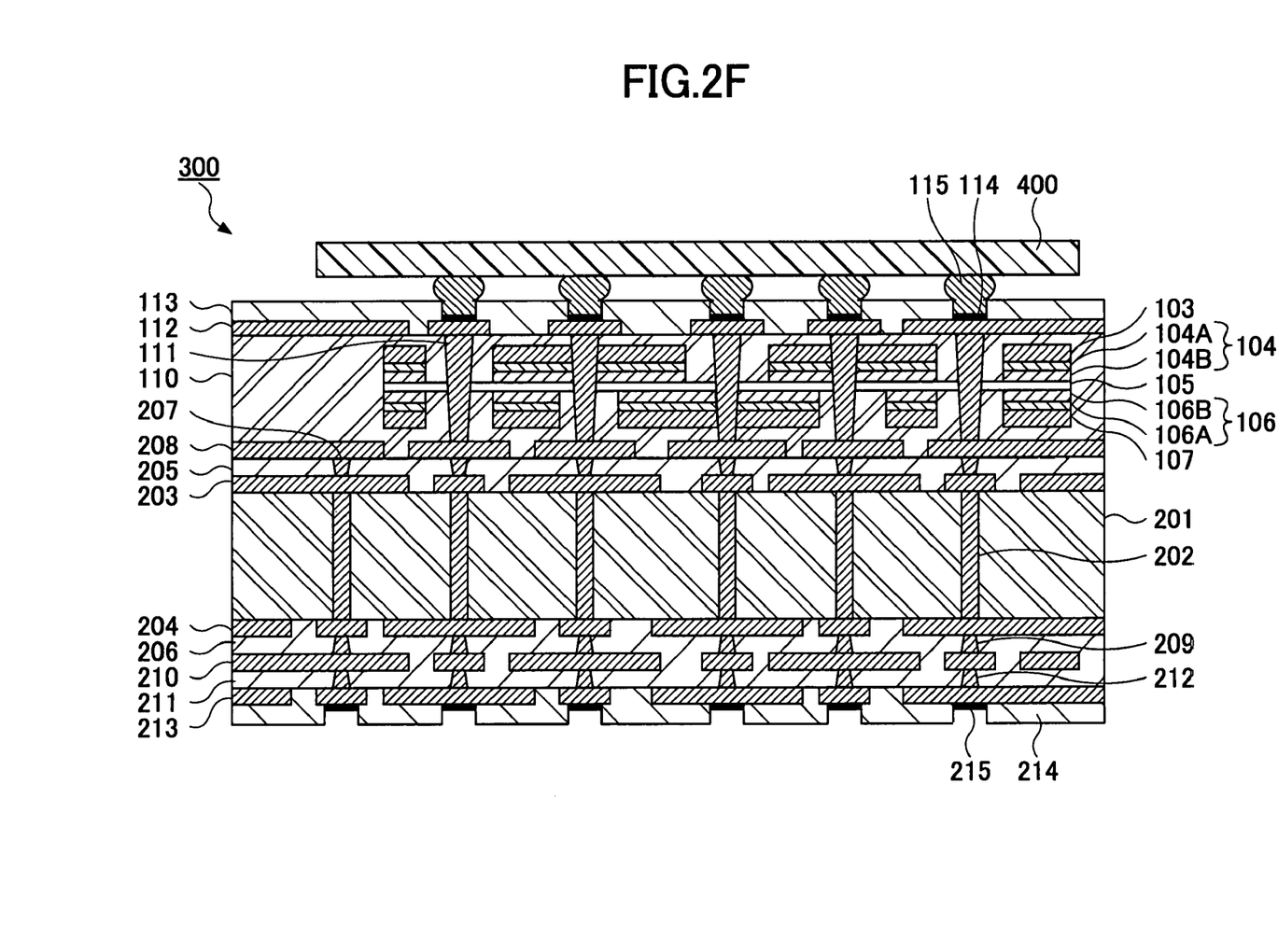
FIG. 2F is a schematic diagram (Part 6) for describing a method for manufacturing a wiring substrate according to an embodiment of the present invention.

In the step shown in FIG. 2F, a plating layer 114 having Ni/Au plating patterns is formed on the pattern wirings 112. Furthermore, a solder resist layer 113, which includes openings exposing the plating layer 114, is formed in a manner covering the pattern wirings 112.

Likewise, another plating layer 215 having Ni/Au plating patterns is formed on the pattern wirings 213. Furthermore, another solder resist layer 214, which includes openings exposing the plating layer 215, is formed in a manner covering the pattern wirings 213.

Furthermore, according to necessity, solder bumps 115 may be formed on the plating layer 114 so that a semiconductor chip 400 can be connected to the solder bumps 115.

Accordingly, the manufacturing of the wiring substrate 300, which has the capacitor 100 mounted therein, is completed. The wiring substrate 300 according to the above-described embodiment of the present invention having its first side connected to the semiconductor chip 400 is configured to electrically connect the semiconductor chip 400 to its second side (the side opposite of the first side of the wiring substrate 300) of the wiring substrate 300 via the via wirings 111, 207, 202, 209, and 212 to which the capacitor 100 is connected.

The capacitor 100 according to the above-described embodiment of the present invention has a configuration in which the interlayer insulation layer surrounding the capacitor 100 serves to support the capacitor 100, thereby no additional component dedicated for supporting the capacitor 100 (e.g. base) need be mounted thereto.

Furthermore, since the capacitor 100 is configured to be mounted to or in the vicinity of the semiconductor chip 400, the induction of the connection between the capacitor 100 and the semiconductor chip 400 can be reduced, the noise of the capacitor 100 can be eliminated, and the voltage of power can be stabilized. These advantages are exhibited particularly for a high performance semiconductor apparatus having high operating frequency.

It is to be noted that the materials, the wiring structure, and the connection configuration of the present invention are not limited to those described in the above-described embodiment of the present invention.

Further, the present invention is not limited to these embodiments, but variations and modifications may be made without departing from the scope of the present invention.

The present application is based on Japanese Priority Application No. 2004-367945 filed on Dec. 20, 2004, with the Japanese Patent Office, the entire contents of which are hereby incorporated by reference.

What is claimed is:

1. A method of manufacturing a wiring substrate to which a semiconductor chip is mounted, the method comprising the steps of:
   forming a base having a surface;
   forming a peeling layer on the entire surface of the base;
   forming a capacitor having a plurality of layers on the peeling layer; and
   forming a plurality of wiring parts in the capacitor for connecting the capacitor to the semiconductor chip;
   wherein the plural layers of the capacitors are formed by performing the steps of:
   forming a first electrode layer on the peeling layer,
   forming a dielectric layer on the first electrode layer, and
   forming a second electrode layer on the dielectric layer;
   further comprising a step of:
   forming via holes in the first and second electrode layers,
   wherein the wiring parts include via wirings that are mounted in the via holes of the first and second electrode layers;
   wherein the step of forming via holes In the first and second electrode layers includes the steps of:
   forming first via holes in the second electrode layer,
   forming an insulation layer on the second electrode layer after the step of forming the first via holes, and
   peeling the base from the first electrode layer and forming second via holes in correspondence with the first via holes after the step of forming the insulation layer.

2. The method of manufacturing a wiring substrate as claimed in claim 1, wherein at least one of the first electrode layer and the second electrode layer includes Cu.

3. The method of manufacturing a wiring substrate as claimed in claim 1, wherein the peeling layer includes at least one of Mo, Ta, and Pt.

4. The method of manufacturing a wiring substrate as claimed in claim 1, further comprising the steps of:
   forming via wirings that penetrate the via holes after the step of forming the via holes; and
   forming a multilayer wiring including the via wirings that electrically connect a first side of the wiring substrate to an oppositely situated second side of the wiring substrate.

5. The method of manufacturing a wiring substrate as claimed in claim 1, wherein
   the dielectric layer includes at least one of $Ta_2O_5$, STO, BST, PZT, and BTO.

6. A method of manufacturing a wiring substrate to which a semiconductor chip is mounted, the method comprising the steps of:
   forming a base;
   forming a peeling layer on the base;
   forming a capacitor having a plurality of layers on the peeling layer;
   forming a plurality of wiring parts in the capacitor for connecting the capacitor to the semiconductor chip;

forming the plural layers of the capacitor by performing the steps of:

forming a first electrode layer on the peeling layer;

forming a dielectric layer on the first electrode layer; and forming a second electrode layer on the dielectric layer;

forming via holes in the first and second electrode layers;

wherein the wiring parts include via wirings that are mounted in the via holes of the first and second electrode layers;

wherein the step of forming via holes in the first and second electrode layers includes the steps of:

forming a first via hole in the second electrode layer;

forming an insulation layer on the second electrode layer after the step of forming the first via hole; and peeling the base from the first electrode layer and forming a second via hole in correspondence with the first via hole after the step of forming the insulation layer.

7. The method of manufacturing a wiring substrate as claimed in claim 6, wherein at least one of the first electrode layer and the second electrode layer includes Cu.

8. The method of manufacturing a wiring substrate as claimed in claim 6, wherein the peeling layer includes at least one of Mo, Ta and Pt.

* * * * *